(12) United States Patent
Kang et al.

(10) Patent No.: US 10,738,394 B2
(45) Date of Patent: Aug. 11, 2020

(54) MOLECULAR BEAM EPITAXY UNDER VECTOR STRONG MAGNETIC FIELD AND IN-SITU CHARACTERIZATION APPARATUS THEREOF

(71) Applicant: XIAMEN UNIVERSITY, Xiamen (CN)

(72) Inventors: Junyong Kang, Xiamen (CN); Chunmiao Zhang, Xiamen (CN); Zhiming Wu, Xiamen (CN); Ting Chen, Xiamen (CN); Na Gao, Xiamen (CN); Yaping Wu, Xiamen (CN); Heng Li, Xiamen (CN)

(73) Assignee: Xiongjun Yan, Shenzhen (CN)

( * ) Notice: Subject to any disclaimer, the term of this patent is extended or adjusted under 35 U.S.C. 154(b) by 298 days.

(21) Appl. No.: 15/859,574

(22) Filed: Dec. 31, 2017

(65) Prior Publication Data
US 2018/0179666 A1    Jun. 28, 2018

(30) Foreign Application Priority Data

Dec. 28, 2016   (CN) .......................... 2016 1 1236161

(51) Int. Cl.
*C30B 23/02*    (2006.01)
*C30B 30/04*    (2006.01)
(Continued)

(52) U.S. Cl.
CPC ............ *C30B 30/04* (2013.01); *C30B 23/002* (2013.01); *C30B 23/02* (2013.01); *C30B 23/025* (2013.01);
(Continued)

(58) Field of Classification Search
CPC .......................... C30B 23/02; H01L 21/02631
See application file for complete search history.

(56) References Cited

U.S. PATENT DOCUMENTS

| | | | | |
|---|---|---|---|---|
| 5,654,566 A | * | 8/1997 | Johnson .................. | G11C 11/16 257/295 |
| 6,139,643 A | * | 10/2000 | Yamamoto ............ | C30B 23/066 118/715 |

(Continued)

*Primary Examiner* — Matthew J Song
(74) *Attorney, Agent, or Firm* — Wayne & Ken, LLC; Tony Hom

(57) ABSTRACT

The present invention discloses a molecular beam epitaxy under vector strong magnetic field and an in-situ characterization apparatus thereof. The apparatus mainly consists of an inverted T-shaped ultrahigh vacuum growth and characterization chamber with a compact structure and a strong magnet. The inverted T-shaped vacuum chamber portion, which disposed in the room-temperature chamber of the strong magnet, includes a compact epitaxial growth sample stage, a device capable of rotating angle between the growth and magnetic field directions, and an in-situ characterization apparatus. The portion disposed below the strong magnet includes a molecular beam source component such as evaporation source, plasma source etc., and a vacuum-pumping system. The present invention surmounts effectively the technical problems between the small volume of the strong magnetic field chamber and numerous components of the growth and test system, and realizes the molecular beam epitaxial growth and in-situ characterization under the strong magnetic field.

9 Claims, 3 Drawing Sheets

(51) Int. Cl.
*H01L 21/66* (2006.01)
*C30B 29/02* (2006.01)
*H01L 43/12* (2006.01)
*C30B 23/00* (2006.01)
*C30B 23/06* (2006.01)
*H01L 21/02* (2006.01)

(52) U.S. Cl.
CPC .............. *C30B 23/06* (2013.01); *C30B 29/02* (2013.01); *H01L 21/02631* (2013.01); *H01L 22/14* (2013.01); *H01L 43/12* (2013.01)

(56) References Cited

U.S. PATENT DOCUMENTS

| | | | |
|---|---|---|---|
| 2005/0126471 A1* | 6/2005 | Jenny | C30B 23/00 117/92 |
| 2007/0137555 A1* | 6/2007 | Yang | C30B 29/605 117/54 |
| 2010/0270534 A1* | 10/2010 | Pioro-Ladriere | B82Y 10/00 257/14 |
| 2011/0270434 A1* | 11/2011 | Fischer | B82Y 5/00 700/117 |
| 2012/0289406 A1* | 11/2012 | Wang | H01F 6/04 505/163 |
| 2017/0178746 A1* | 6/2017 | Nagaosa | H01L 43/08 |
| 2018/0179666 A1* | 6/2018 | Kang | C30B 23/002 |
| 2019/0025339 A1* | 1/2019 | Wu | G01Q 30/18 |

* cited by examiner

MOLECULAR BEAM EPITAXY UNDER VECTOR STRONG MAGNETIC FIELD AND IN-SITU CHARACTERIZATION APPARATUS THEREOF

TECHNICAL FIELD

The present invention relates to molecular beam epitaxy and in-situ characterization thereof, and more particularly relates to molecular beam epitaxy under vector strong magnetic field and in-situ characterization apparatus thereof.

BACKGROUND

With the rapid development of information science, higher requirements for the running speed, data storage density, power consumption and other parameters of electronic components are needed. Existing electronic components represented by integrated circuits or superlarge-scale integrated circuits only control the degree of freedom of electronic charges, and ignore the other basic quantum attribute of electron spin, resulting in that the dimension, integration, etc. of the electronic components have already substantially reached a theoretical physical limit. The quantum control for the electron spin facilitates rapid data processing, reduction of power consumption, improvement of integration and so on has already become an emerging important branch of a semiconductor physics.

The core of the quantum control for the electron spin is how to effectively control a spin orientation, spin transport and spin detection. However, in the aspect of the growth of spin electron materials, there are still difficulties such as impedance mismatch of ohmic injection of semiconductor heterojunctions, significant interface scattering, low Curie temperature of a diluted magnetic semiconductor, low quality of a tunnel injection ferromagnetic thin film, non-sharp interface, high tunneling barrier and the like (1. J. W. A. Robinson, J. D. S. Witt, M. G. Blamire, Science, 329(2010), 59; 2. K. Sato, L. Bergqvist, J. Kudrnovsky, Rev. Mod. Phys., 82(2010), 1633; 3. G. Schmidt, D. Ferrand, L. W. Molenkamp, Phys. Rev. B, 62(2000), R4790), which are basically closely related to the quality control and magnetic performance control of the materials in the growth process. In the aspect of the spin transport, the spin relaxation time and a coherence length observed at present are relatively short; the spin detection is generally carried out outside the sample preparation chamber, and the spin characteristics may be influenced by various atoms absorbed on the surface when the sample is exposed to the air. On the other hand, due to the notable difference of a magnetic material thin film of a spin semiconductor heterojunction in length, width and thickness, there is high demagnetizing field in a direction perpendicular to the thin film, so that the magnetic moment of the material is basically parallel to the plane of the thin film and different in directions, thereby not facilitating the acquisition of spin current with high polarization rate. In order to change the magnetic structure, the annealing is generally carried out in a magnetic field of thousands of Gaussian. Although this mode achieves some effects, it is difficult to fundamentally change the magnetic structure of the material by introducing the magnetic field after growth, as the lattice structure of the material mainly depends on the atomic arrangement in the preparation process. Therefore, the direct epitaxial growth of materials under strong magnetic field is beneficial to the formation of a more uniform magnetic domain structure, thus acquiring the spin current with high polarization rate. Furthermore, it is expected to prepare the magnetic material with a vertical magnetic structure by either changing the angle between the strong magnetic field and a growth plane of the thin film material, or designing and preparing an asymmetric heterogenous thin film structure thus reducing or counteracting the effect of the demagnetizing field in the vertical direction. The neatly-arranged magnetic moments of the magnetic material generate a strong equivalent magnetic field on the surface of the semiconductor heterogeneous, thereby improving larmor procession of spin electrons, suppressing the dephasing process, and prolonging the spin relaxation time finally.

However, the current room-temperature chamber of the strong magnet is small in size (generally the inner diameter is smaller than 10 cm); and to achieve the fine growth of the magnetic thin film material (requiring multiple evaporation sources and ion sources) and in-situ characterization, multiple components need to be equipped in the chamber, and the system should be multi-functions with complicated structure. Therefore, if the ultrahigh vacuum can be achieved in the room-temperature chamber, the free path of molecules would be increased significantly (an average free path of the molecules can reach tens of meters under the vacuum of $10^{-4}$ Pa), so that a multi-growth-beam source can be moved out of the strong magnetic field chamber, and the molecular beam epitaxial growth of the thin film material can be realized. Furthermore, the growth rate, components and crystal structure of the material could be controlled accurately in the atomic scale, so that the technical problems for preparing the high-quality spin semiconductor with sharp interface can be solved. Meanwhile, the in-situ transport characterization of the sample is performed in an ultrahigh vacuum environment with strong magnetic field, so that the influence of various atoms adsorbed on the surface on the spin characteristics can be effectively avoided in the growth and characterization process. Furthermore, the in-situ characterization has the advantages of high sensitivity, good resolution and so on, and the physical mechanism related to the spin can be more intuitively and accurately studied. It is beneficial to better understanding the electron spin quantum characteristics of semiconductors, discover new phenomena, master new rules and propose new control methods.

SUMMARY

Aim at shortages of the existing growth and characterization device in the aspects of the growth and characterization of spin electronic materials, a molecular beam epitaxy under vector strong magnetic field and in-situ characterization apparatus thereof is provided.

The present invention is provided with a strong magnet, an inverted T-shaped ultrahigh vacuum growth and characterization chamber, an epitaxial growth sample stage, a linkage control system, an in-situ characterization and control apparatus, a molecular beam furnace source and a vacuum-pumping system.

The strong magnet is a liquid-helium-free spiral strong magnet with a room-temperature chamber;

the portion, which is disposed in a room-temperature chamber of the strong magnet, of the invert T-shaped ultrahigh vacuum growth and characterization chamber adopts a dual-layer multi-channel cooling structure with a thickness of 5 mm. The space of the vacuum chamber, which is disposed below the strong magnet, of the inverted T-shaped ultrahigh vacuum growth and characterization chamber is larger than that of the portion disposed in the room-temperature chamber of the strong magnet;

the epitaxial growth sample stage and the linkage control system are disposed in the room-temperature chamber of the strong magnet; and the rotation of the epitaxial growth sample stage is controlled by the linkage control system for changing the angle between the growth plane and the magnetic field from 0° to 90°;

the in-situ characterization and control apparatus is arranged in the room-temperature chamber of the strong magnet and is provided with a slope cooling unit, a probe detection apparatus, an up-down moving and rotating mechanism and a multifunctional operating lever, and the slope cooling unit is an independently-operable cooling apparatus matched with the structure of the epitaxial growth sample stage; the slope cooling unit is provided with a liquid nitrogen pool; and the probe detection apparatus can move up and down and rotate for the switching from epitaxial growth and testing;

the molecular beam furnace source is provided with a molecular beam growth source component which is disposed below the strong magnet and can place a plurality of evaporation sources and radio-frequency gas plasma sources; and the vacuum-pumping system is provided with a mechanical pump, a molecular pump, an ion pump and a titanium pump, and the vacuum-pumping system is disposed below the strong magnet and used for providing ultrahigh vacuum with a vacuum degree higher than 10-8 Pa.

An inner diameter of the room-temperature chamber is smaller than 10 cm, and the strong magnet can provide a magnetic field up to 15 T with the homogeneity of 0.1%.

The epitaxial growth sample stage can adopt a reverse double-strand energizing radiation heating mode, so that an overall Lorentz force of a conducting wire is substantially zero, the conducting wire with large current can be prevented from damaging the component due to the high Lorentz force under the strong magnetic field, and the epitaxial growth of the material heated from the room temperature to the temperature zone higher than 1300K can be realized.

The probe detection apparatus is equipped with more than six probes; and the in-situ characterization mainly depends on the in-situ Hall effect and the magnetic resistance test, adopts an amperemeter of pA-grade and even fA-grade sensitivity and a voltmeter of nV-grade sensitivity, and adopts a bridge designing method to connect the wire.

The evaporation source can adopt ferromagnets (Fe, Co, Ni, etc.) and metals (Pt, Pd, etc.) to provide a source material for the epitaxial growth of various materials on a semiconductor substrate (MgO, $Al_2O_3$, GaN, etc.); the radio-frequency gas plasma source is oxygen, nitrogen or other gas sources; and the evaporation source can be heated from the room temperature to a high temperature of 1600K and is controlled by an accurate programming Proportional Integral Differential (PID) temperature control unit.

The present invention provides molecular beam epitaxial growth capable of rotating an angle between a sample growth plane and a magnetic field under an ultrahigh vacuum strong magnetic field, and an in-situ characterization apparatus depending on the Hall effect and the magnetic resistance test. The apparatus mainly consists of an inverted T-shaped ultrahigh vacuum growth and characterization chamber with a compact structure and a strong magnet with a small room-temperature chamber, wherein an inverted T-shaped vacuum chamber portion disposed in the room-temperature chamber of the strong magnet includes a compact epitaxial growth sample stage and an in-situ characterization apparatus capable of adjusting an angle between the magnetic field and the sample stage; and a portion disposed below the strong magnet includes a molecular beam source component such as an evaporation source, a plasma source and the like, as well as a vacuum-pumping system; and by utilizing the characteristic of a long free path of a molecular beam flow in an ultrahigh vacuum, a multi-beam source can be moved out of the strong magnetic field chamber. The present invention effectively overcomes the technical problems between the small volume of the strong magnetic field chamber and numerous components of the growth test system, and realizes the molecular beam epitaxial growth and in-situ characterization under the strong magnetic field.

BRIEF DESCRIPTION OF THE DRAWINGS

In FIG. 1, reference numerals are as follows:

1: strong magnet; 2: inverted T-shaped ultrahigh vacuum growth and characterization chamber; 3: epitaxial sample stage, linkage control system and in-situ characterization and control apparatus; 4: molecular beam furnace source; 5: stainless steel support; 6: fixing support; 7: damping air column stand bar; 8: mechanical pump and molecular pump; 9: ion pump; and 10: titanium pump.

Figure 1:
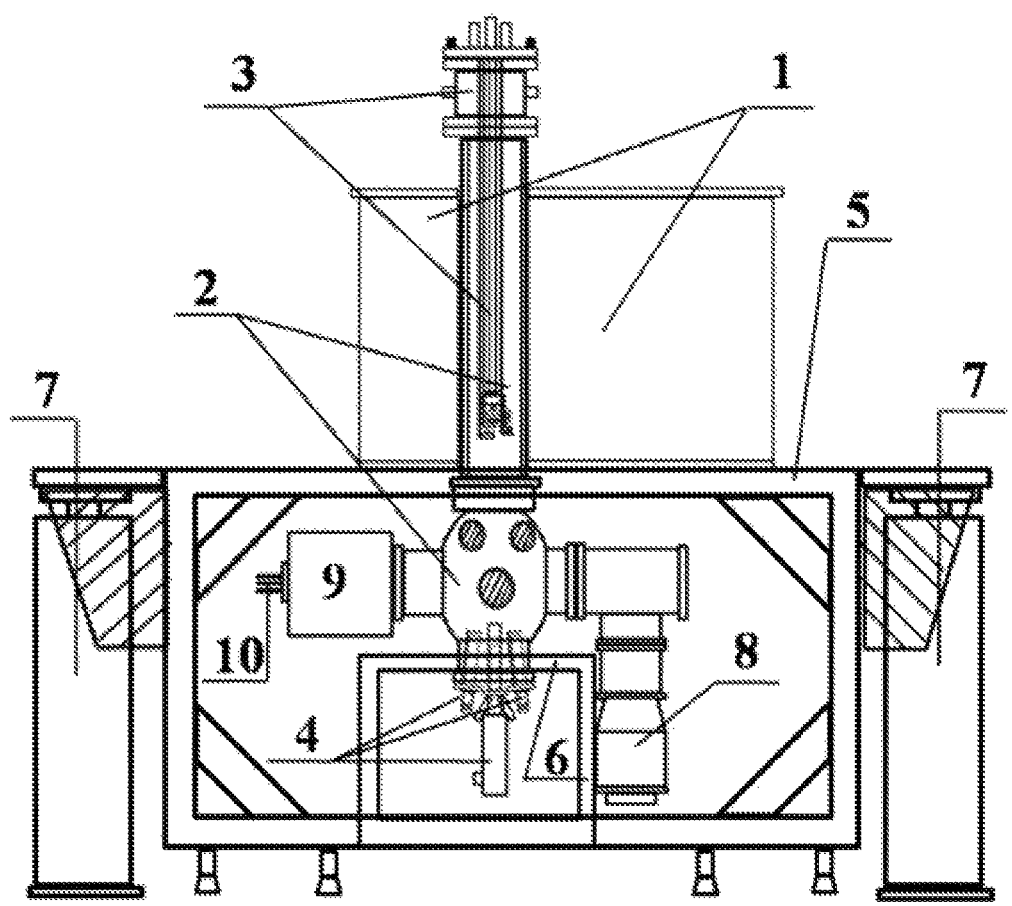
FIG. 1 is a structural schematic diagram of embodiments of the present invention.
Figure 2:
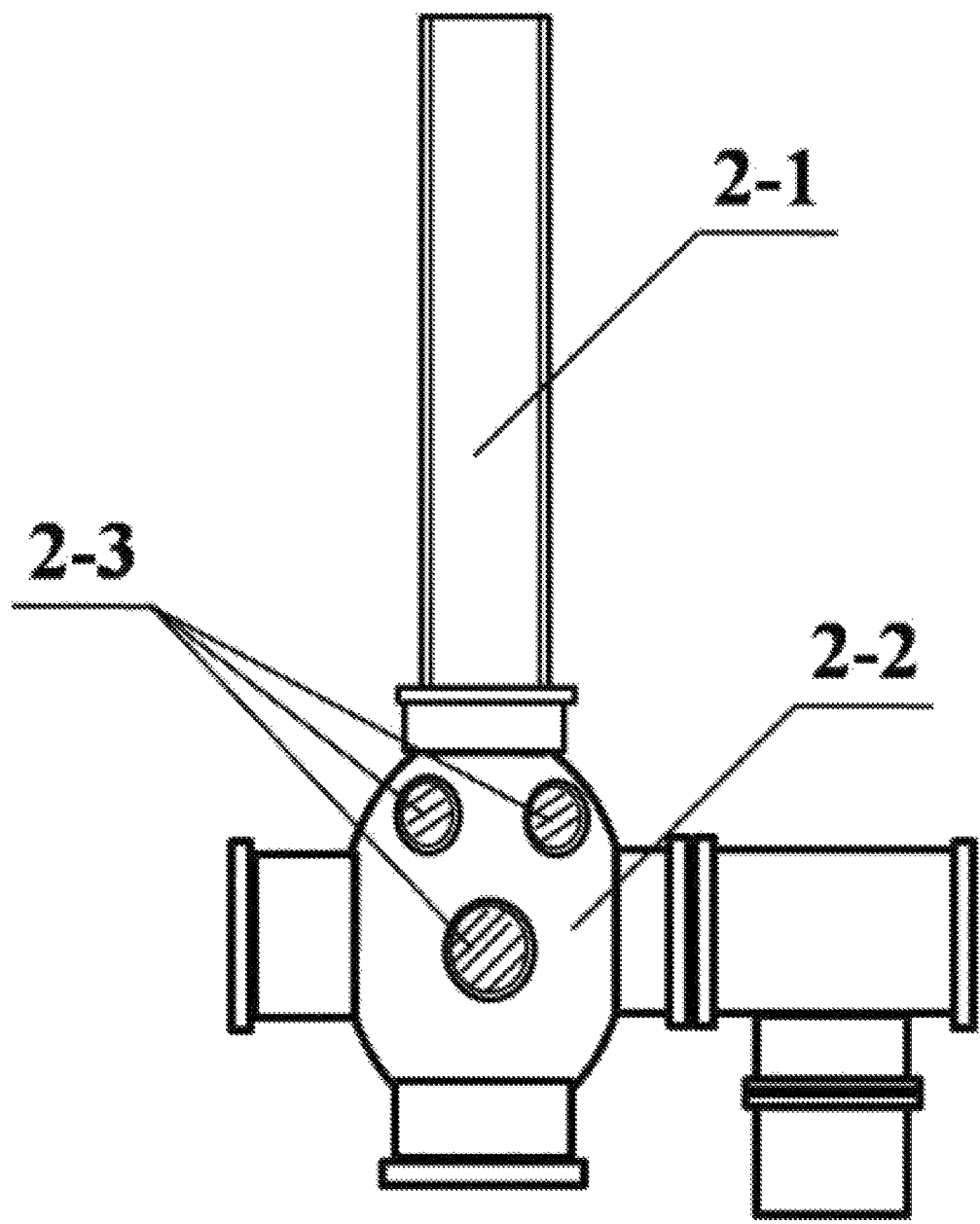

FIG. 2 is a structural schematic diagram of an inverted T-shaped ultrahigh vacuum growth and characterization chamber. In FIG. 2, 2-1: upper half portion of the chamber disposed in a room-temperature of the strong magnet and having an ultrathin dual-layer and multi-channel cooling structure; 2-2: lower half portion chamber of the strong magnet; and 2-3: observation window.

Figure 3:
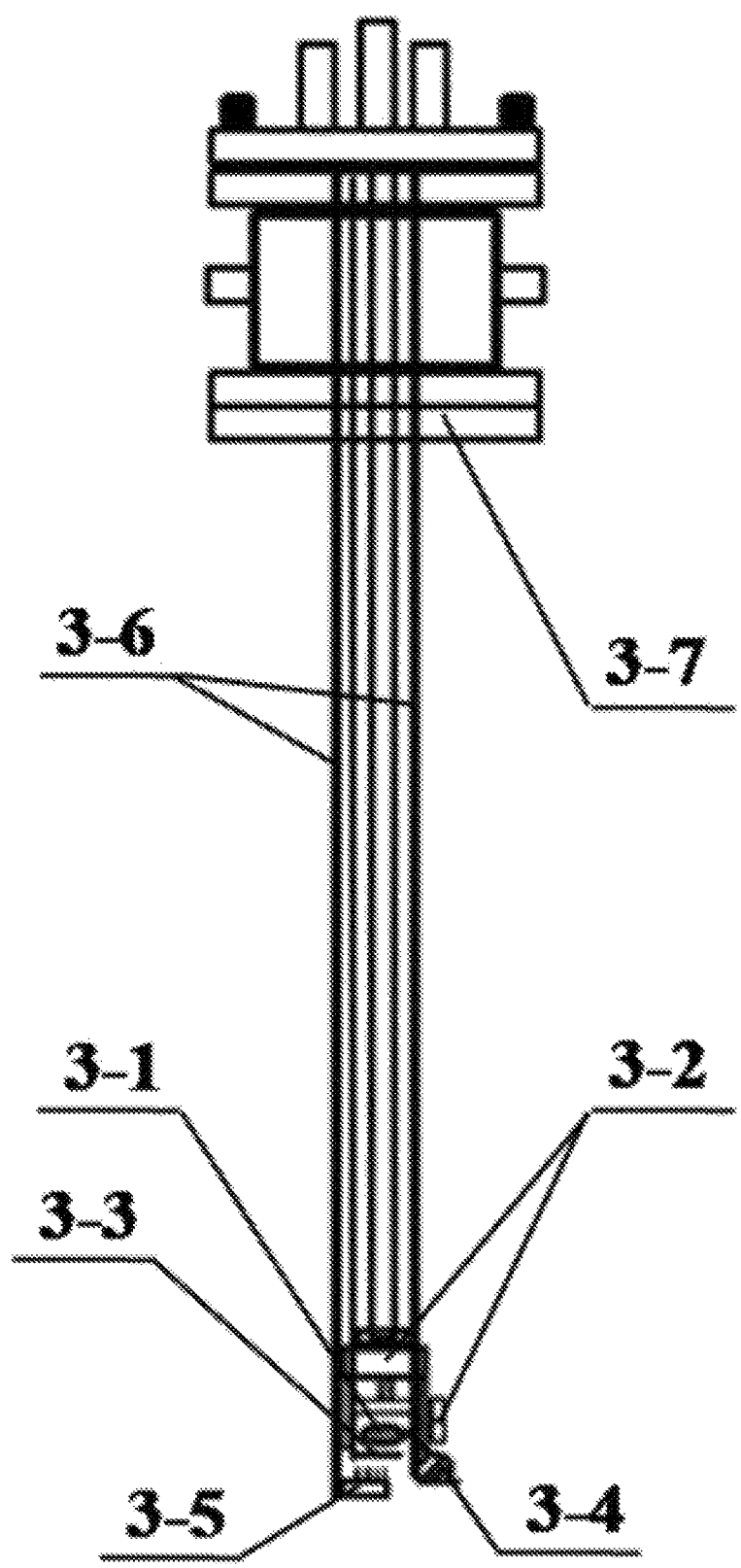

FIG. 3 is a schematic diagram of an epitaxial growth sample stage, a linkage control system and an in-situ characterization and control apparatus. In FIG. 3, 3-1: epitaxial growth sample stage; 3-2: sample stage rotating mechanism; 3-3: movable baffle plate; 3-4: slope cooling unit; 3-5: in-situ probe platform; 3-6: up-down moving and rotating mechanism; and 3-7: upper sealing flange.

DETAILED DESCRIPTION OF THE EMBODIMENTS

The present invention is described below in detail in combination with attached drawings and embodiments, but the protection scope of the present invention is not limited to the following embodiments.

The present invention is provided with a strong magnet, an inverted T-shaped ultrahigh vacuum growth and characterization chamber, an epitaxial growth sample stage, a linkage control system, an in-situ characterization and control apparatus, a molecular beam furnace source, a vacuum-pumping system and a probe detection apparatus.

The strong magnet is a liquid-helium-free spiral strong magnet with a room-temperature chamber; and the inner diameter of the room-temperature chamber is smaller than 10 cm, and the strong magnet can provide a magnetic field up to 15 T and with the homogeneity of 0.1%.

The portion, which is disposed in the room-temperature chamber of the strong magnet, of the inverted T-shaped ultrahigh vacuum growth and characterization chamber adopts a dual-layer multi-channel cooling structure with a thickness of 5 mm, thereby having a good heat insulation and cooling function, and ensuring the normal work of the magnet; and the space of a vacuum chamber of the portion disposed below the strong magnet, of the inverted T-shaped ultrahigh vacuum growth and characterization chamber is larger than that of the portion disposed in the room-temperature chamber of the strong magnet, thereby facilitating the placement of a plurality of growth sources.

The epitaxial growth sample stage and the linkage control system are disposed in the room-temperature strong magnet; the rotation of the epitaxial growth sample stage is controlled by the linkage control system for greatly changing an angle between a growth plane and the magnetic field from 0° to 90°, and the molecular beam epitaxy is controlled by a movable baffle plate in front of the epitaxial growth sample stage at the beginning and the end of the growth; and the epitaxial growth sample stage adopts a reverse double-strand energizing radiation heating mode, so that the overall Lorentz force of the conducting wire is substantially zero, so that the component can be prevented from being damaged by the conducting wire with large current due to the high Lorentz force under the strong magnetic field, and the material epitaxial growth from the room temperature to a temperature zone higher than 1300K is realized.

The in-situ characterization and control apparatus is arranged in the room-temperature chamber of the strong magnet; the in-situ characterization and control apparatus is provided with a slope cooling unit, a probe detection apparatus, an up-down moving and rotating mechanism and a multifunctional operating lever, and the slope cooling unit is an independently-operable cooling apparatus matched with the structure of the epitaxial growth sample stage; and the slope cooling unit is high in heat conduction coefficient and large in contact area and is provided with a small-volume liquid nitrogen pool, so that the temperature of the sample can be changed from the temperature of the liquid nitrogen to a high temperature.

The probe detection apparatus can move up and down and rotate and is used for the epitaxial growth and test switch; the probe detection apparatus is provided with six probes; the probes can be arranged according to the sample shape and the test type, and the in-situ spin electron transport characteristic characterization at different temperatures can be finally realized; the in-situ characterization mainly depends on the in-situ Hall effect and the magnetic resistance test, adopts the amperemeter of the pA-grade sensitivity and even fA-grade sensitivity and the voltmeter of the nV-grade sensitivity, and adopts a bridge designing method to connect wires; the currently-common graphical programming tool LabVIEW software in the industry is adopted, so that the control and data acquisition for the amperemeter, the voltmeter and the strong magnet can be realized; and the complete system can measure the magnetic resistance up to 1 GS and achieve the Hall test accuracy up to $10^{-9}$, and achieves the magnetic resistance and Hall test in excess of ferromagnetic metals, semiconductor materials and heterojunction thereof in situ.

The molecular beam furnace source is provided with a molecular beam growth source component disposed below the strong magnet and can place a plurality of evaporation sources and radio-frequency gas plasma sources at a small angle, so that the evaporation source material is ensured to directly shine on a sample substrate during the epitaxial growth process of the material; the evaporation source can adopt ferromagnets (Fe, Co, Ni, etc.), and metals (Pt, Pd, etc.) to provide a source material for the epitaxial growth of various materials on the semiconductor substrate (MgO, $Al_2O_3$, GaN, etc.); the radio-frequency gas plasma source is oxygen, nitrogen or other gas sources; and the evaporation source can be heated from the room temperature to the high temperature of 1600K and is controlled by the accurate programming Proportional Integral Differential (PID) temperature control unit.

The vacuum-pumping system is provided with a mechanical pump, a molecular pump, an ion pump and a titanium pump, and the vacuum-pumping system is disposed below the strong magnet and used for providing ultrahigh vacuum with the vacuum degree higher than $10^{-8}$ Pa; and the influence of various atoms adsorbed to the surface of the sample during the growth and characterization process on the spin characteristics can be avoided, so that the physical mechanism related to the spin can be more intuitively and precisely studied.

Specific embodiments are described below, as shown in FIG. 1 to FIG. 3.

The present invention relates to molecular beam epitaxy under a vector strong magnetic field and an in-situ characterization apparatus thereof; and the embodiment consists of a strong magnet 1, an inverted T-shaped ultrahigh vacuum growth and characterization chamber 2, an epitaxial sample stage, a linkage control system, an in-situ characterization and control apparatus 3, a molecular beam furnace source 4, a stainless steel support 5, a fixing support 6, a damping air column stand bar 7, a molecular pump 8, an ion pump 9 and a titanium pump 10. The strong magnet 1 is arranged on the stainless steel support 5; the inverted T-shaped ultrahigh vacuum growth and characterization chamber 2 is supported by the fixing support 6; an upper half portion 2-1 is disposed in the strong magnet 1, a lower half portion 2-2 is disposed below the strong magnet 1, the fixing support 6 is connected with the damping air stand bar 7 through a stainless steel plate, the epitaxial sample stage and the linked control system thereof and the in-situ characterization and control apparatus 3 are arranged on the upper half portion 2-1 of the inverted T-shaped ultrahigh vacuum growth and characterization chamber and connected with the external control system through an upper sealing flange 3-7; and the molecular beam furnace source, the mechanical pump, the molecular pump 8, the ion pump 9 and the titanium pump 10 are connected with the lower half portion 2-2 of the inverted T-shaped ultrahigh vacuum growth and characterization chamber through the sealing flange.

Epitaxial growth of ferromagnetic metal Co thin film on a MgO substrate and in-situ characterization thereof are taken as an embodiment below:

(1) Firstly the inverted T-shaped ultrahigh vacuum growth and characterization chamber 2 and a valve connected with atmosphere are slowly opened, so that the pressure of the vacuum chamber is kept the same as outside atmospheric pressure.

(2) The linkage apparatus is operated so as to take out the epitaxial growth sample stage 3-1 from the inverted T-shaped ultrahigh vacuum growth and characterization chamber 2, and then the MgO substrate (5×12 mm$^2$) is arranged on the epitaxial growth sample stage 3-1 and then placed back into the inverted T-shaped vacuum chamber 2.

(3) The sealing flange 3-7 connecting the inverted T-shaped vacuum chamber 2 and the outside is locked, and the valve in (1) is closed. Then the mechanical pump, the molecular pump 8 and the ion pump 9 are successively opened so as to perform the vacuum-pumping operation, and the titanium pump 10 is intermittently opened, so that the vacuum degree of the system is decreased from an atmosphere pressure to the ultrahigh vacuum degree.

(4) Cooling water and a heating power supply of the sample stage are started, and the MgO substrate is necessarily annealed according to actual needs so as to obtain a smoother substrate surface. In the epitaxial growth process, the temperature of the sample stage is up to 1300K.

(5) The liquid-helium-free strong magnet 1 is opened, the helium is finally compressed to the liquid helium state (about 4.2K) through the continuous work of the compressor for about 48 hours, and a magnetic field of different magnetic induction intensities is obtained by applying different currents to a superconductor coil; and the system of the present invention can realize the epitaxial sample growth of a variable magnetic field up to 15 T.

(6) The heating temperature of the metal Co source (the purity is 99.9999%) is accurately controlled by the PID temperature control unit, and the beginning process and the end process of the sample growth are controlled by the movable baffle plate 3-3 disposed in front of the sample stage. At the beginning of the epitaxial growth, the movable baffle plate 3-3 disposed below the sample stage is opened, and a rotating angle of the sample stage is adjusted through the external linkage control system and the sample stage rotating mechanism 3-2, so that the independent adjustment of an angle (0° to 90°) between different growth planes and the magnetic field is achieved. The intensity of the magnetic field is kept unchanged in the whole epitaxial growth process; and the molecular beam furnace source 4 and the inverted T-shaped vacuum chamber 2 are cooled by circulating water. The deposition velocity can be strictly controlled at the single-atomic-layer accuracy of 0.1 to 1 nm/min by selecting an appropriate source furnace temperature, and the epitaxial Co thin film of the atomic-scale accuracy can be obtained by accurately controlling the temperature of the evaporation source and the epitaxial growth time.

(7) At the end of the growth, the movable baffle plate 3-3 in front of the sample stage is closed and is slowly lowered until the current for controlling the heating of the growth source is turned off. According to the actual needs, necessary annealing is performed for the epitaxial growth sample so as to obtain better crystal quality. Then the heating current of the sample stage is gradually decreased to zero, and the intensity of the magnetic field is still kept unchanged in the subsequent annealing and sample cooling process; and until the temperature of the epitaxial growth sample is lowered below the Curie temperature, the intensity of the magnetic field is reduced to zero, and the stability of the magnetic structure in the epitaxial growth process of the material is ensured.

(8) In the process of performing in-situ spin electron transport characterization for the epitaxial growing Co thin film, the slope cooling apparatus 3-4 is enabled to firstly contact the epitaxial growth sample stage 3-1 through the up-down moving and rotating mechanism 3-6; and liquid nitrogen is introduced into the liquid nitrogen pool of the slope cooling unit, the sample can be refrigerated by the liquid nitrogen, and the temperature of the sample stage can be controlled by the external temperature control apparatus. By selecting the appropriate temperature, an in-situ probe platform 3-5 is controlled and moved by the up-down moving and rotating mechanism 3-6, so that the probes on the in-situ probe platform 3-5 electrically contact the growing Co thin film well and are connected with the external control and measurement apparatus. By respectively applying the pA-grade current and the nV-grade voltage to the growing Co thin film and utilizing the LabVIEW software to acquire data, the in-situ Hall effect and the magnetic resistance test can be completed. In the whole test process, the chamber is kept at an ultrahigh vacuum state, and various atoms adsorbed on the surface of the Co thin film exposed in the air can be effectively prevented from influencing the spin characteristics, so that the spin-related properties of the epitaxial Co thin film can be characterized and studied more accurately and deeply.

What is claimed is:

1. A molecular beam epitaxy under a vector magnetic field and an in-situ characterization apparatus thereof, comprising a magnet, an inverted T-shaped ultrahigh vacuum growth and characterization chamber, an epitaxial growth sample stage, a linkage control system, an in-situ characterization and control apparatus, a molecular beam furnace source and a vacuum-pumping system;

wherein the magnet is a liquid-helium-free spiral magnet with a room-temperature chamber;

the inverted T-shaped ultrahigh vacuum growth and characterization chamber, which is disposed in a room-temperature chamber of the magnet, adopts a dual-layer multi-channel cooling structure with a thickness of 5 mm; and the space of the inverted T-shaped ultrahigh vacuum growth and characterization chamber, which is disposed below the magnet, is larger than that of the portion disposed in the room-temperature chamber of the magnet;

the epitaxial growth sample stage and the linkage control system are disposed in the room-temperature chamber of the magnet; and the rotation of the epitaxial growth sample stage is controlled by the linkage control system for changing an angle between the growth and the magnetic field direction from 0° to 90°;

the in-situ characterization and control apparatus is arranged in the room-temperature chamber of the magnet and is provided with a slope cooling unit, a probe detection apparatus, an up-down moving and rotating mechanism and a multifunctional joystick; and the slope cooling unit is an independently-operable cooling apparatus matched with the epitaxial growth sample stage; the slope cooling unit is provided with a liquid nitrogen pool; and the probe detection apparatus can move up and down and rotate for the switching from epitaxial growth and testing;

the molecular beam furnace source is provided with a molecular beam growth source component disposed below the magnet and can place a plurality of evaporation sources and radio-frequency gas plasma sources;

the vacuum-pumping system is provided with a mechanical pump, a molecular pump, an ion pump and a titanium pump, and the vacuum-pumping system is disposed below the magnet and used for providing ultrahigh vacuum with a vacuum degree higher than $10^{-8}$ Pa.

2. The molecular beam epitaxy under the vector magnetic field and the in-situ characterization apparatus thereof according to claim 1, wherein an inner diameter of the room-temperature chamber is smaller than 10 cm.

3. The molecular beam epitaxy under the vector magnetic field and the in-situ characterization apparatus thereof according to claim 1, wherein the magnet provides a magnetic field up to 15T with the homogeneity of 0.1%.

4. The molecular beam epitaxy under the vector magnetic field and the in-situ characterization apparatus thereof according to claim 1, wherein the epitaxial growth sample stage adopts a reverse double-strand energizing radiation heating mode.

5. The molecular beam epitaxy under the vector magnetic field and the in-situ characterization apparatus thereof according to claim 1, wherein the probe detection apparatus is equipped with more than six probes.

6. The molecular beam epitaxy under the vector magnetic field and the in-situ characterization apparatus thereof according to claim 1, wherein the in-situ characterization mainly depends on an in-situ Hall effect and a magnetic resistance test, adopts an amperemeter of pA-grade and even fA-grade sensitivity and a voltmeter of nV-grade sensitivity, and adopts a bridge circuit designing method to connect the wire.

7. The molecular beam epitaxy under the vector magnetic field and the in-situ characterization apparatus thereof according to claim 1, wherein the evaporation source adopts ferromagnets metals.

8. The molecular beam epitaxy under the vector magnetic field and the in-situ characterization apparatus thereof according to claim 1, wherein the radio-frequency gas plasma source is oxygen or nitrogen.

9. The molecular beam epitaxy under the vector magnetic field and the in-situ characterization apparatus thereof according to claim 1, wherein the evaporation source is heated from room temperature to a high temperature of 1600K and is controlled by an accurate programming (Proportional Integral Differential (PID) temperature control unit.

\* \* \* \* \*